United States Patent [19]

Mahler

[11] 3,820,352

[45] June 28, 1974

[54] EVAPORATIVE COOLANT HEAT SINK

[76] Inventor: Richard A. Mahler, 77 Golf Rd., Ridgefield, Conn. 06877

[22] Filed: Jan. 5, 1973

[21] Appl. No.: 321,451

[52] U.S. Cl. ........................ 62/293, 62/458, 62/514, 165/168, 165/171, 128/303.1

[51] Int. Cl. ........................ F25d 3/00

[58] Field of Search ...... 62/293, 514, 458; 165/168, 165/171

[56] References Cited

UNITED STATES PATENTS

| | | | |
|---|---|---|---|
| 1,025,817 | 5/1912 | Luckenbach | 165/168 |
| 1,847,573 | 3/1932 | Rupp | 165/171 |
| 2,129,987 | 9/1938 | Berkson | 62/514 |
| 2,645,097 | 7/1953 | Posch | 62/293 |
| 3,369,550 | 2/1968 | Armao | 62/293 X |
| 3,423,953 | 1/1969 | Spiller | 62/514 |
| 3,573,557 | 2/1970 | Riggs | 62/514 X |
| 3,696,813 | 10/1972 | Wallach | 62/293 |

*Primary Examiner*—William J. Wye

*Attorney, Agent, or Firm*—Weingarten, Maxham & Schurgin

[57] ABSTRACT

An efficient localized heat sink for use in the assembly and disassembly of electronic circuits. An evaporative coolant is caused to flow to a thermally conductive fitting attached to an electronic component or element being protected. The evaporation of the coolant on the fitting causing cooling thereof and cooling of the associated circuit element in conductive relation therewith. The conducting fitting can be of various configurations to accommodate particular circuit elements to be cooled.

3 Claims, 5 Drawing Figures

PATENTED JUN 28 1974 3,820,352

EVAPORATIVE COOLANT HEAT SINK

FIELD OF THE INVENTION

This invention relates to heat sinks and more particularly to a heat sink employing an evaporative coolant for localized cooling of associated elements.

BACKGROUND OF THE INVENTION

During assembly and disassembly of electronic circuits it is often desirable to prevent excessive heat being applied to a solder junction from being conducted to associated components or elements which are usually quite sensitive to heat. To solder or unsolder an electronic component from a circuit board, it is quite common to attach a heat sink to the lead of the component to which heat is to be applied to prevent the conduction of excess heat to the component itself. Typically, a pair of pliers is held in contact with the lead being heated to serve as the heat sink. The pliers must be held onto the lead with one hand which detracts from the efficiency of the assembly or disassembly operation as two hands are usually needed to manipulate the soldering tool and solder, or, in the case of disassembly, the soldering tool and a solder removing device. Heat sinks are also known for attachment to an electrical component lead, however such devices are quite limited in their capacity to absorb heat especially over long periods of time, since these heat sinks are initially at room temperature and dissipate heat by radiation to the atmosphere.

SUMMARY OF THE INVENTION

In accordance with the invention, a highly efficient heat sink is provided by cooling a conductive fitting by evaporation thereon of a coolant to a temperature considerably below room temperature. The conductive fitting is connected to a circuit component to be protected, and upon being cooled by the evaporative coolant supplied thereto causes sufficient heat sinking of the associated circuit element to substantially prevent heat conduction to the components. The evaporative coolant is typically supplied to the conductive fitting by means of an aerosol container connected to the fitting by means of a flexible tube. Coolant can be supplied at repeated intervals to maintain a requisite low operating temperature. The fitting can be of various physical configurations to suit specific requirements. For example, the fitting can be in the form of a clip attachable to the lead of an electrical component, or can be adapted to contact several electrical leads of a multi-lead device such as an integrated circuit. The fitting is of a thermally conductive material and may be electrically insulative in order to prevent the shorting of the leads of a component which may be energized during soldering or unsoldering thereof. The invention is also useful to cool an electrical component or circuit to detect an intermittent failure or for low temperature testing.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
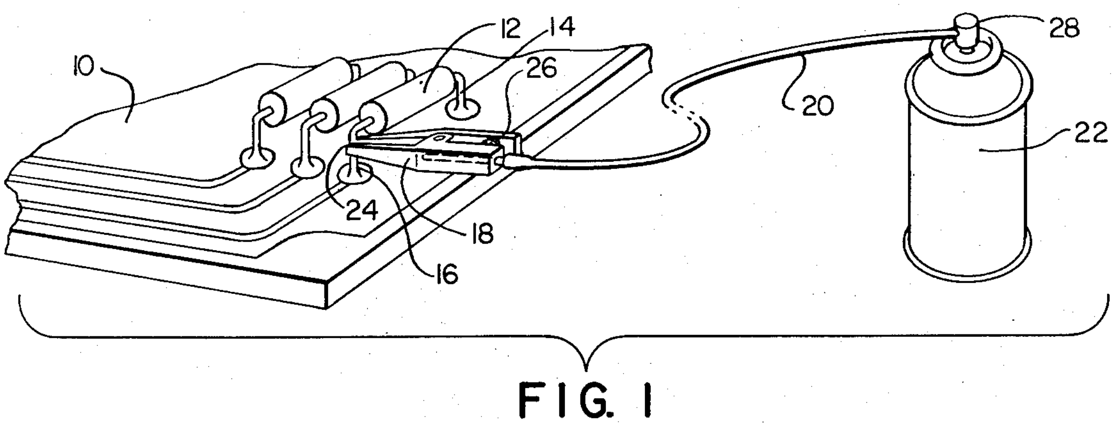
FIG. 1 is a pictorial view of an evaporative coolant heat sink according to the invention.

Referring to FIG. 1, there is shown a portion of a printed circuit 10 having an electrical component such as resistor 12 connected in circuit thereon by means of leads 14 and 16. An object of the invention is to provide an efficient means for soldering and unsoldering a component from a circuit board without thermal damage to the component. According to the invention, a thermally conductive fitting 18 is affixed to lead 16 of component 12 and is coupled via a tube 20 to a source of evaporative coolant such as aerosol container 22. The conductive fitting 18 in the illustrated embodiment is in the form of a manually operable clip having jaw portions 24 urged into engagement by means of a spring 26 supported between the upper and lower sections of the fitting. The fitting is of thermally conductive material and may also be electrically conductive. Typically, the clip is formed of metal although a suitable electrically insulative material may be employed where it is desirable to not have the fitting in electrical contact with the component being thermally protected.

The evaporative coolant contained within aerosol container 22 is typically Freon but may be any suitable coolant having intended temperature characteristics to provide the desired degree of cooling. The provision of coolant in the form of an aerosol can is particularly advantageous as the novel heat sink apparatus is portable and can be carried, for example, in a tool kit or used on a workbench for use during soldering and unsoldering of electrical components. The aerosol coolant supply also provides a ready means for maintaining the low operating temperature of fitting 18 and the lead 16 connected thereto.

In operation, the fitting 18 is clipped onto lead 16 of the associated component 12, and the valve 28 of aerosol container 22 is manually depressed to supply a quantity of coolant to fitting 18. The fitting by the evaporative action of the coolant is cooled to a temperature well below room temperature as is the lead 16 to which the fitting is attached. Heat applied to lead 16, such as for soldering or unsoldering of the lead to an associated circuit path, tends to be conducted to fitting 18 rather than component 12 by reason of the lower temperature of the fitting. An efficient heat sink is thereby provided which substantially prevents any thermal damage to the electrical component being operated upon.

The invention, while finding particular application in soldering and unsoldering electrical components, is also useful in the nondestructive testing of such components. In such latter application, the conductive fitting can be attached to any suitable location of an electrical component and the fitting and the associated component cooled by application of coolant from the coolant source such as aerosol container 22. The low operating temperature of the component can be maintained by repeated actuations of valve 28 to maintain the low temperature during observation of the performance of the electrical component or the associated circuit in which it is connected. The invention finds further utility in repetitively cooling an electrical component to detect an intermittent failure which is more likely to occur during temperature cycling.

Figures 2, 3, 4, 5:
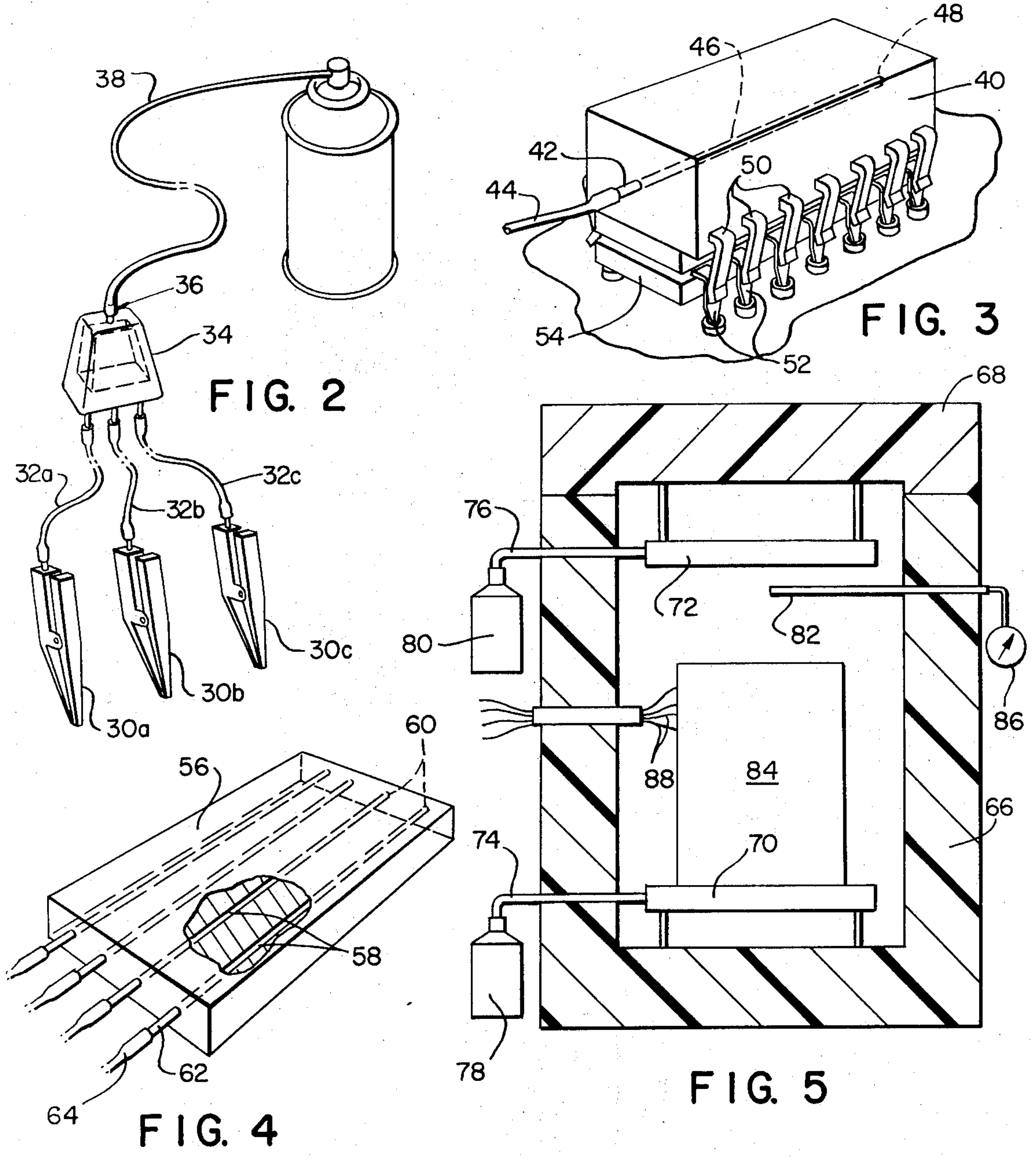
FIG. 2 is a pictorial view of another embodiment of the invention.
FIG. 3 is a pictorial view of an embodiment of the invention useful in simultaneously contacting the plural leads of an integrated circuit or like component.
FIG. 4 is a pictorial view of a cooling plate useful according to the invention.
FIG. 5 is a cutaway pictorial view of a cooling chamber embodying the invention.

An alternative embodiment of the invention is depicted in FIG. 2 wherein a plurality of conductive fittings are supplied with evaporative coolant from a single source. Each conductive fitting 30*a*, 30*b* and 30*c* is connected to a length of tubing 32*a*, 32*b* and 32*c*, respectively, the opposite ends of which are connected to a flow splitter 34 having an input coupling 36 connected to a tube 38 which, in turn, is connected to an aerosol container or other source of evaporative coolant. The flow splitter 34 directs a portion of the received coolant to respective tubes 32 for cooling of the corresponding fittings 30. These fittings are connected to respective terminals of an electrical component or respective points of a circuit or other apparatus to be locally cooled.

In FIG. 3, there is illustrated a conductive fitting having means for conductive attachment to the respective leads of an integrated circuit or other multiple lead component. A housing 40 of thermally conductive material includes a coupling 42 attached to a tube 44 which is connected to a source of evaporative coolant. The coupling 42 communicates with a passage 46 provided along the length of housing 40 and which terminates in an opening 48 communicative with the atmosphere. Coolant is supplied to housing 40 via tube 44 and flows within passage 46 and evaporates via opening 48 to achieve the cooling effect. A plurality of conductive feet 50 is provided along the confronting bottom edges of housing 40, each in a position to be in intimate engagement with an associated electrical lead 52 of an integrated circuit 54 on which the fitting is mounted. The feet 50 are typically formed in an integral manner with housing 40, but can alternatively be separately formed and attached to the housing. The foot configuration may be electrical conductive, or can be electrically insulative in the event that the heat sink is to be employed with the underlying component energized, in order to prevent short circuiting of the component leads. The housing 40 can also include test points accessible along the top surface thereof and respectively connected to the component leads. Such test points provide ready means of electrical connection to the component leads such as for attachment of test leads while the component is being cooled.

It is often desirable to cool an entire circuit board or planar circuit substrate to a lower temperature for testing purposes, and the invention in the embodiment of FIG. 4 is effective for this purpose. A plate 56 of thermally conductive material, typically a metal such as aluminum, is provided with a plurality of passages 58 extending throughout the length thereof and terminating in respective openings 60 communicative with the atmosphere. The input end of each passage 58 is coupled via a coupling 62 to tube 64 which is connected to a source of coolant such as the aerosol container 22 of the embodiment shown in FIG. 1. During operation, coolant is caused to flow via tubes 64 through passages 58 to cause cooling of plate 56 to serve as a heat sink for a circuit board or other unit disposed on a surface thereof. The low operating temperature of the plate is easily maintained by refreshing the coolant which can be periodically supplied thereto.

The cooling plate such as that shown in FIG. 4 can be incorporated within an insulated enclosure to provide an extremely simple and low cost cooling chamber such as employed for low temperature testing of electrical circuits and devices. Such a chamber is depicted in FIG. 5 and includes a housing 66 having a removable cover 68, the housing and cover portion being formed of an insulative material such as a foamed plastic. Cooling plates 70 and 72 are disposed within housing 66, respectively, at the bottom and top portions thereof, and each plate is coupled via a respective tube 74 and 76 to a source of evaporative coolant such as associated aerosol containers 78 and 80. A temperature sensor 82 can be disposed within the chamber in proximity to a device 84 being tested. The temperature sensor is typically coupled to an indicator 86 located externally of container 66. The electrical leads 88 of device 84 are coupled externally of the container through the wall thereof, as illustrated. With evaporative coolant being provided by containers 78 and 80 to respective plates 70 and 72, the interior of chamber 66 can be maintained at a requisite low temperature for cooling device 84 to an intended degree such as for low temperature testing thereof. It will be appreciated that in each of the embodiments described above, cooling can be maintained by providing a fresh supply of evaporative coolant to the conductive fitting associated with the work being cooled. Such repetitive supply of coolant can be accomplished manually or by suitable automatic means which periodically directs a stream of coolant to the conductive fitting.

It will be appreciated that the invention can be embodied in a variety of physical implementations to suit particular requirements. Accordingly, it is not intended to limit the invention by what has been particularly shown and described except as indicated in the appended claims.

What is claimed is:

1. A portable hand-held localized heat sink for electrical components comprising:

a portable evaporative coolant supply including an aerosol container having a manually actuable supply valve coupled to a coolant outlet and operative to provide an intermittent supply of coolant upon manual actuation;

at least one thermally conductive fitting adapted to be detachably affixed to at least one terminal of an electrical component to be cooled and in heat absorbing contact therewith;

a flexible tube interconnecting the outlet of said aerosol container and said at least one thermally conductive fitting and having a passage for flow of coolant to said at least one thermally conductive fitting upon actuation of said supply valve;

said at least one thermally conductive fitting including:

a coupling attached to an end of said tube to permit flow of said coolant onto said fitting;

a clip section adapted for removable attachment to said at least one terminal; and a thermally massive section having sufficient thermal mass to remain below a desired temperature for a predetermined period of time after having been cooled by application of coolant thereto;

said coolant, upon actuation of said supply valve, flowing through said tube from said aerosol container and through said coupling onto said at least one fitting, to cool said at least one fitting to serve as a heat sink for said at least one electrical component.

2. A portable hand-held localized heat sink according to claim 1 wherein said at least one thermally conductive fitting comprises a plurality of fittings each connected to at least one lead of an electrical component.

3. A localized heat sink according to claim 1 wherein said at least one conductive fitting includes:

a housing of thermally conductive material;

a plurality of thermally conductive feet each operative to engage a respective lead of a multiple lead electrical component in thermal coupling relationship therewith;

a fluid coupling connected to said fluid path and communicating with at least one passage provided along the length of said housing;

said at least one passage having an opening communicative with the atmosphere.

* * * * *